United States Patent [19]

Smith et al.

[11] 4,221,978
[45] Sep. 9, 1980

[54] ELECTRONIC TIME SWITCH

[76] Inventors: Charles C. Smith, 16442 Antietam Ave.; Alvin P. Rougeau, Jr., 15710 Ferrell Ave., both of Baton Rouge, La. 70816

[21] Appl. No.: 927,090

[22] Filed: Jul. 24, 1978

[51] Int. Cl.$^2$ ............... H03K 17/60; H03K 1/12
[52] U.S. Cl. ................... 307/252 B; 307/290
[58] Field of Search .................. 307/297, 252 B

[56] References Cited

U.S. PATENT DOCUMENTS

| 3,335,291 | 8/1967 | Gutzwiller | 307/252 B |
| 3,883,782 | 5/1975 | Beckwith | 307/252 B |

Primary Examiner—Harold A. Dixon
Attorney, Agent, or Firm—Sughrue, Rothwell, Mion, Zinn and Macpeak

[57] ABSTRACT

An electronic time switch for an A.C. power system and employing a Triac as the switching element is disclosed. The time switch in its normal or OFF state provides a very small amount of current to the load so as to preheat the filament without the filament emitting any appreciable visible light when the load is an incandescent lamp. The user changes the time switch to the ON state by manually depressing a first switch, which causes the time switch to provide full power to the load within a short time thereafter. After a portion of a predetermined time period or ON cycle has elapsed, the time switch starts to decrease the power to the load at an ever-increasing rate until the time switch returns to the normal or OFF state after the lapse of the predetermined time period. The user, by manually depressing a second switch, may immediately return the time switch to the OFF state at any time during the ON cycle. Moreover, the user, during either the OFF or the ON cycle, may check whether the time switch is functioning properly by keeping the second switch depressed. During such a check, the time switch provides less than one-half power to the load. Modifications of the time switch to provide either a remote control feature or a light-responsive feature are also disclosed.

10 Claims, 12 Drawing Figures

| TTL | LAMP |
|-----|------|
| H | OFF |
| L | ON |

| TTL | LAMP |
|-----|------|
| H | OFF |
| L | ON |

| LIGHT | LAMP |
|-------|------|
| ON | ON |
| OFF | OFF |

EXAMPLE FOR STATIC OPERATION

| LIGHT TRIGGE | LAMP "TIMED" |
|---|---|
| ⊓ | ⌐‾‾ |

EXAMPLE FOR DYNAMIC PRIMARY LIGHT SOURCE

ELECTRONIC TIME SWITCH

BACKGROUND OF THE INVENTION

1. Field of the Invention

The present invention relates generally to electronic switches for A.C. power systems, and, more particularly, to electronic switches for A.C. power systems employing a Triac switch element that is normally in the OFF state, but is in the ON state for a predetermined time period after receipt of a user command.

2. Description of the Prior Art

Electronic switches employing Triac switching elements for switching loads connected to an A.C. power system are well known.

Sure electronic switches which also produce a time switching function are well known. Representative of these are the switches shown in U.S. Pat. Nos. 4,008,416; 3,732,484; 4,002,925; and 3,979,601.

None of these switches, however, suggest the structure of or functions produced by the time switch of the present invention.

SUMMARY OF THE INVENTION

It is an object of the present invention to provide an electronic time switch having a Triac switching element for an A.C. power system, where the time switch is normally in the OFF state but can be changed to the ON state upon receipt of a user command.

It is another object to provide a time switch which remains in the ON state only for a predetermined period of time after receipt of the user command, and then automatically returns to the normal or OFF state.

It is a further object to provide a time switch which, after the lapse of a portion of the predetermined time period, starts to decrease the output power at an ever-increasing rate until the lapse of the predetermined time period, at which time, the time switch is in the normal or OFF state.

It is another object to provide a time switch which, when in the normal or OFF state, provides a very small amount of output power.

It is a further object to provide a time switch which, when in the ON state, returns immediately to the normal or OFF state upon receipt of a user command.

It is another object to provide a time switch which provides less than one-half of the normal output power upon receipt of a user command, thus providing the capability of a status check of the time switch, or of momentary, low-intensity operation.

It is a further object to provide a time switch which, when going from the OFF state to the ON state, does so in a short period of time, but does not do so instantaneously.

It is another object to provide a time switch which provides a remote-control capability at a low level control voltage.

It is a further object to provide a time switch which is responsive to a triggering light source.

Finally, it is an object to provide a time switch which is small in size and can be mounted in a standard switch box.

The aforementioned objects are realized by the various embodiments of the time switch of the present invention. Each of the embodiments of the disclosed electronic time switch for an A.C. power system employs a Triac as the switch element. The disclosed time switch, in its normal or OFF state, provides a small amount of current to the load. When the load is an incandescent light bulb, this very small amount of current acts to preheat the filament of the light bulb but is not of a sufficient level to cause the filament to emit any visible light. The user can change the time switch to the ON state by manually depressing a first switch, causing the time switch to provide full power to the load within a short time thereafter. After a portion of a predetermined time period or ON cycle has elapsed, the time switch starts to decrease the power to the load at an ever-increasing rate until the time switch returns to the normal or OFF state after the lapse of the predetermined time period. Thus, the time switch automatically returns to the OFF state after the lapse of the ON cycle. The user, by manually depressing a second switch, may immediately return the time switch to the OFF state at any time during the ON cycle. Moreover, the user, during either the OFF or ON cycles, may check whether the time switch is functioning properly by keeping the second switch depressed. This also serves as a means for momentarily activating the load at a reduced power level. During such a check, the time switch provides approximately one-third power to the load. Alternate embodiments of the time switch provide either a remote-control feature employing low level control voltages or a light-responsive ON cycle feature.

DESCRIPTION OF THE PREFERRED EMBODIMENTS

Figure 1:
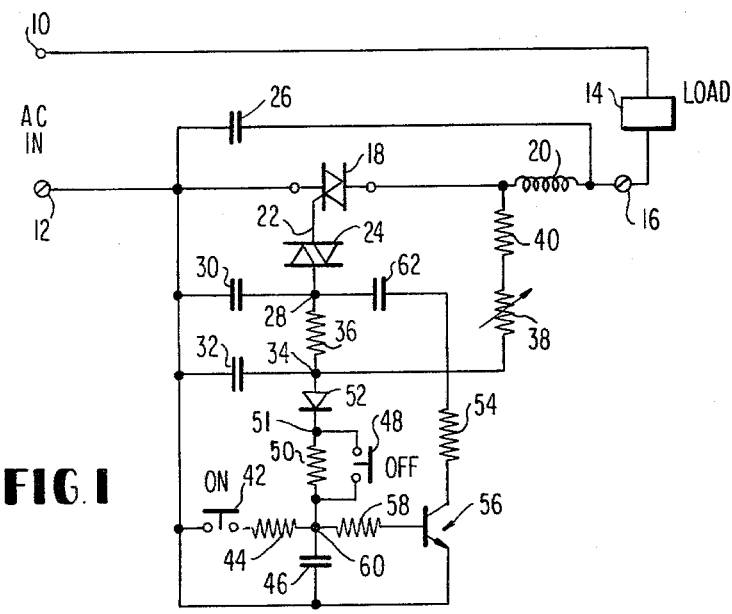
FIG. 1 is the schematic of the electronic circuit of the basic embodiment of the time switch.

Referring now to FIG. 1, the schematic diagram of the electronic circuit of the time switch of the present invention is shown. It should be understood at the outset that with appropriate values for the electrical components, the time switch will operate with any alternating current (A.C.) power system, regardless of the voltage or hertz (Hz) employed by that system.

The time switch is connected to the A.C. power system at terminals 10 and 12. One side of the load 14 selectively controlled by the time switch is connected to terminal 10, and the other side is connected to a terminal 16. It should be understood that load 14 is not part of the time switch and is only shown in FIG. 1 for purposes of explanation. In other words, the time switch of the present invention encompasses only those electronic components found between terminals 12 and 16, as shown in FIG. 1.

One of the two main terminals of a Triac 18 of conventional design is connected to terminal 12, and the second main terminal of Triac 18 is connected via an inductor 20 to terminal 16. The gate 22 of Triac 18 is connected to a Diac 24, discussed below. The Triac is a well-known electronic component, and its operation is well understood by those having ordinary skill in the electronic arts. Good explanations of the theory of operation as well as electrical descriptions of commercially available Triacs can be found in many reference sources, including: *RCA Thyristors/Rectifiers,* SSD-206C, 1975 Databook Series, page 359; and *The Radio Amateur's Handbook, 55th Edition,* American Radio Relay League, Newington, Conn., 1978, at pages 100–101.

As is well known in the art, a Triac is an electronic device that performs the functions of two silicon controlled rectifiers for full-wave operation, and can easily be triggered on both halves of the A.C. sine-wave cycle. On either half of the sine-wave cycle, the Triac allows current to flow through its main terminals when a trigger current of appropriate level and polarity is applied to its gate terminal. Once the Triac is triggered, it allows current to flow through its main terminals until the current at the main terminals approaches zero, at which point the Triac returns to the OFF state. The Triac remains in the OFF state until it again is triggered by an appropriate trigger current at the gate terminal. It is now apparent that each trigger pulse places the Triac into the ON state for a maximum time period equal to one-half of the sine-wave cycle, and that the polarity of the trigger pulse must be the same as that of the half of the sine-wave cycle being controlled.

A capacitor 26 is connected between terminals 12 and 16. Capacitor 26 and inductor 20 together form a radio frequency interference filter, which acts to protect Triac 18 from transients from the A.C. power system at terminals 10 and 12, and also prevents the time switch from providing transients caused by the switching action of Triac 18 to the load 14 or the A.C. power system. It should be noted that the radio frequency interference filter of capacitor 26 and inductor 20 is well known in electronic switching, and the electrical values of these two components, therefore, can be readily calculated.

As stated above, one of the two terminals of Diac 24 is connected to the gate terminal 22 of Triac 18. The other terminal of Diac 24 is connected to a node 28. Diacs are well known in the electronic arts. For purposes of explanation, a Diac can be characterized as being two diodes in back-to-back connection. Because of this back-to-back connection, it is readily apparent that a Diac is normally in the OFF state, but goes into conduction or the ON state when a signal having a voltage amplitude greater than the forward bias breakdown value of one of the two internal diodes is applied to the Diac. In other words, a Diac is an electronic switch having a deadband or OFF region between the positive forward bias breakdown region and the negative forward bias breakdown region. Referring to FIG. 1, it is seen that Diac 24 only provides a positive or negative voltage signal to the gate terminal 22 of Triac 18 when the positive or negative voltage at node 28 exceeds the positive or negative breakdown value of Diac 24, respectively. In this connection, it should be noted that the actual voltage provided to terminal 22 by Diac 24 when it is in the ON state is always going to be less than the value at node 28 by an amount equal to the ON state voltage drop of Diac 24.

A capacitor 30 is connected between terminal 12 and node 28, as shown in FIG. 1. A capacitor 32 is connected on one side to terminal 12 and on the second side to a node 34. A resistor 36 is connected between node 28 and node 34. A variable resistor 38 in series connection with a fixed value resistor 40 are connected between node 34, and the main terminal of Triac 18 connected to inductor 20. Variable resistor 38 provides an electronic dimmer function and, therefore, can be replaced with a fixed value resistor if the dimmer function is not wanted.

The first terminal of a single-pole, single-throw momentary contact switch 42 is connected to terminal 12. Switch 42 is normally in the OFF state and goes into the ON state only as long as sufficient force is applied to its switching element. The other terminal of switch 42 is connected to a resistor 44, which, in turn, is connected to a node 60.

The anode of a diode 52 is connected to node 34. The cathode of diode 52 is connected to the first terminal of a single-pole, single-throw momentary contact switch 48. Switch 48 is normally in the OFF state, and goes into the ON state only as long as sufficient force is applied to its switching element. The other terminal of switch 48 is connected to node 60. A resistor 50 is connected between the two terminals of switch 48.

A capacitor 46 is connected between node 60 and terminal 12, as shown in FIG. 1. A resistor 58 is connected between node 60 and the base of a transistor 56. Transistor 56 as shown is bipolar of the NPN type, but it should be understood that transistor 56 can be of the PNP type if the polarity of diode 52 is reversed. The emitter of transistor 56 is connected to terminal 12. The collector of transistor is connected to node 28 via a resistor 54 and a capacitor 62 in series connection.

Figure 3A:
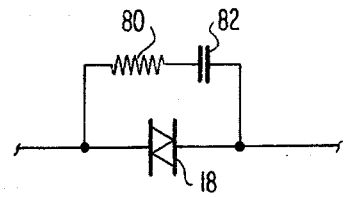
FIG. 3A shows the modification of the electronic circuit of FIG. 1 so that the time switch can accommodate a load having a lagging reactive component.
Figure 3B:
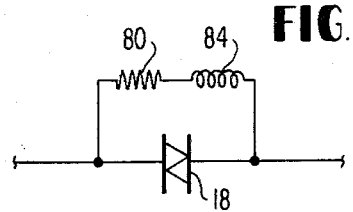
FIG. 3B shows the modification of the electronic circuit of FIG. 1 so that the time switch can accommodate a load having a leading reactive component.

Before the operation of the time switch of FIG. 1 is presented, it should be understood that load 14 is one exhibiting a purely resistive load without any reactive component, such as an incandescent light bulb or the like. However, when load 14 is one exhibiting a reactive component along with the resistive component, the circuit of FIG. 1 must be appropriately modified. For example, when load 14 is one exhibiting a lagging reactive component along with the resistive component, such as that produced by the inductance of an A.C. motor, a resistor 80 in series with a capacitor 82 must be connected between the two main terminals of Triac 18, as shown in FIG. 3A. Alternately, when load 14 is one exhibiting a leading reactive component along with the resistive component, such as that produced by a capacitive load, an inductor 84 in series with resistor 80 must be connected between the two main terminals of Triac 18, as shown in FIG. 3B.

Figure 2A:
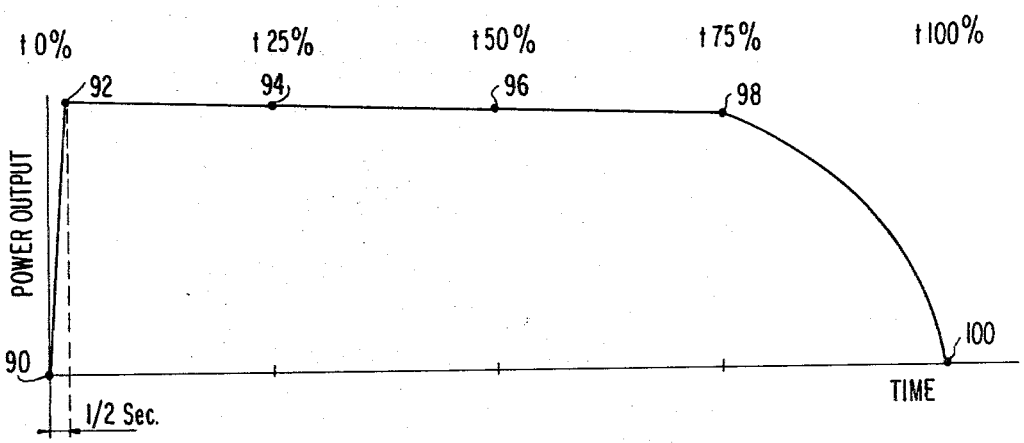
FIG. 2A plots a complete ON cycle of the time switch with the vertical axis representing output power provided by the time switch and the horizontal axis representing time.

Turning now to FIGS. 1 and 2A, the first or normal mode of operation of the time switch of the present invention will now be presented. When neither of the switches 42 or 48 has been depressed, only a very small amount of power (typically, 2 milliwatts) is being provided to load 14 because Diac 24 is providing no trigger pulses to the gate 22 of Triac 18, and, thus, Triac 18 is in the OFF state. The small amount of power provided to load 14 when the time switch is in its normal or OFF state is produced by the small flow of A.C. current through the current branches of capacitor 26, of capacitor 32 in series with resistors 38 and 40 and inductor 20, and of capacitor 30 in series with resistors 36, 38 and 40 and inductor 20.

This small amount of power provided to load 14 when the time switch is in its normal or OFF states constitutes the preheat filament feature of the present invention. As is well known in the art, the filament of an incandescent light bulb exhibits a much lower resistance when in the cold state than in the hot state. Because of this low resistance, substantially more current flows through the filament when such a cold light bulb is first turned ON. Typically, a incandescent light bulb with a cold filament when first turned ON draws 12 times more power than in the steady-state condition. It is readily apparent that the surge of current that flows through the cold filament of an incandescent bulb when it is first turned ON has a deleterious effect on the filament because of the physical and thermal shock induced thereby. Studies have shown that the current surge present in a cold filament substantially reduces the mean-time-between-failure of an incandescent light bulb. The preheat filament feature of the present invention results in a substantial increase in the mean-time-between-failure of the incandescent light bulb connected as load 14 because a trickle of power is continually provided to its filament when the time switch is OFF, this trickle being sufficient to keep the filament preheated, but insufficient to cause the filament to emit any visible light.

As stated above, when switch 42 has not been depressed for a substantial period of time, Triac 18 is OFF because Diac 24 is not providing any trigger pulses to gate terminal 22. This is the normal or OFF condition of the time switch. Diac 24 is not providing trigger pulses because the voltage at node 28 never exceeds the positive or negative breakdown voltage level of Diac 24.

In order to understand why this is so, it should be realized that capacitor 30 charges during each half-cycle of the sine wave of the A.C. power source at a rate determined by the R-C time constant of capacitor 30, together with resistors 36, 38 and 40. Capacitor 32 also charges during each half-cycle at a rate determined by the R-C time constant of capacitor 32, together with resistors 38 and 40. Because resistor 36 present in the current branch of capacitor 30 is not present in the current branch of capacitor 32, capacitor 32 charges to a slightly higher voltage level and assures stable and optimum performance by rapidly restoring the voltage level on capacitor 30 after each trigger pulse, as discussed below.

Moreover, capacitor 46 is charged up because it is provided charging voltage during each positive-going half-cycle through the rectifier action of diode 52 in series connection with resistor 50. Because capacitor 46 is charged, it continuously keeps transistor 56 in the ON state by providing forward bias voltage through resistor 58 to the base of transistor 56. By being in the ON state, transistor 56 prevents the voltage level at node 28 from exceeding in either the positive or negative sense the breakdown voltage of Diac 24. This is so because capacitor 62 and resistor 54 are connected in parallel with capacitor 30 when transistor 56 is ON, and due to the added capacitance, they prevent the voltage at node 28 from exceeding the breakdown voltage of Diac 24.

It is important to realize that the circuit used to keep Triac 18 normally in the OFF state does not degrade its electrical performance in any way and uses only a negligible amount of power.

FIG. 2A shows a normal ON cycle for the time switch and plots on the vertical axis electric power provided to load 14 with respect to time on the horizontal axis. Point 90 represents the normal or OFF state of the time switch.

In order to change the time switch to the ON state, the user depresses the switch member of switch 42 so as to momentarily close the switch contacts. The momentary closing of the switch contacts causes capacitor 46 to very rapidly discharge through resistor 44, because resistor 44 has a very low resistance. Because capacitor 46 is now discharged, it no longer provides sufficient bias voltage through resistor 58 to the base of transistor 56, and, thus, transistor 56 goes to the OFF state. By being OFF, transistor 56 no longer connects capacitor 62 and resistor 54 in parallel with capacitor 30 and, therefore, allows capacitor 30 to charge up to the level where it can provide to node 28 positive and negative voltages of amplitudes (corresponding to the half-cycle of the sine wave being applied to capacitor 30) sufficient to exceed the breakdown voltage of Diac 24. As stated above, each time the voltage at node 28 exceeds the breakdown voltage of Diac 24, Diac 24 provides a trigger pulse to gate terminal 22, which turns Triac 18 ON for that half-cycle of the sine wave. Moreover, capacitor 32 charges to a slightly higher voltage level, as stated above, and assures stable and optimum performance by quickly restoring the voltage level on capacitor 30 after each trigger pulse.

As shown in FIG. 2A, it takes approximately ½ second between the time the user depresses switch 42 (point 90) and the time that full power is provided by the time switch to load 14 (point 92). This delay between points 90 and 92 is deliberate because the life of the filament of an incandescent light bulb (whether cold or preheated) is increased by applying the electric power relatively gradually rather than instantaneously. The time period between points 90 and 92 is substantially determined by the R-C time constant of resistor 44 and capacitor 46 to turn transistor 56 OFF and the time it takes to charge capacitor 46 to full value. It is apparent that the electrical values of these components can be selected to obtain a different time period between points 90 and 92.

At point 92 of FIG. 2A, maximum power is being provided by the time switch to load 14. At this point, transistor 56 is always OFF because capacitor 46 is fully discharged and is only receiving a very small charging pulse during each positive half-cycle from resistor 50 since resistor 50 has a very high resistance value. Points 94, 96 and 98 represent the 25%, 50% and 75% times, respectively, of the ON cycle of the time switch. It should be noted that the time period between points 92 and 98 of the ON cycle are selected by the electrical values of the R-C circuit consisting of diode 52, resistor 50 and capacitor 46.

Figure 7:
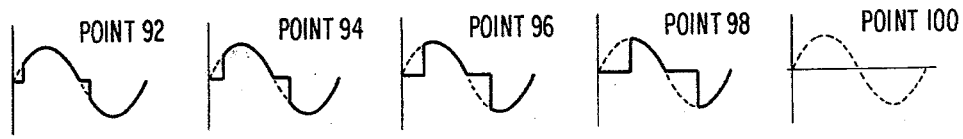
FIG. 7 plots a full cycle of the voltage provided by the time switch to load 14 for the times in the ON cycle corresponding to points 92, 94, 96, 98 and 100, as shown in FIG. 2A. The dashed lines in the five waveform plots indicate the waveform of the input voltage present at terminals 10 and 12 of FIG. 1.

FIG. 7 plots a full cycle of the voltage provided by the time switch to load 14 for the times in the ON cycle corresponding to points 92, 94, 96, 98 and 100, as shown in FIG. 2A. The dashed lines in the five waveform plots of FIG. 7 indicate the waveform of the input voltage present at terminals 10 and 12.

Figure 8:
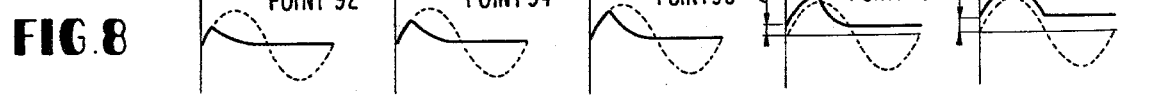
FIG. 8 plots a full cycle of the voltage present at a node 51, as shown in FIG. 1, for the times in the ON cycle corresponding to points 92, 94, 96, 98 and 100, as shown in FIG. 2A. The dashed lines in the five waveform plots indicate the waveform of the input voltage present at terminals 10 and 12.

FIG. 8 plots a full cycle of the voltage present at a node 51 (which is at the junction of switch 48, resistor 50 and diode 52, as shown in FIG. 1) for the times in the ON cycle corresponding to points 92, 94, 96, 98 and 100, as shown in FIG. 2A. The dashed lines in the five waveform plots of FIG. 8 indicate the waveform of the input voltage present at terminals 10 and 12.

As shown by the waveform plots of FIG. 8, the voltage present at node 51 for each positive half-cycle increases between points 92 and 100, with the maximum occurring at point 100. This results in a corresponding increase in the level of the DC voltage present at node 60. In other words, the charge on capacitor 46 increases from point 92 to point 100, with the level at point 100 being of the value (for example, 5.5 volts) sufficient to turn transistor 56 ON continuously for each half-cycle.

The ever-increasing charge on capacitor 46 between points 92 and 100 causes transistor 56 to be turned ON earlier and earlier in each half-cycle. Thus, the off portion of each half-cycle during which capacitor 62 and resistor 54 are connected in parallel with capacitor 30 becomes longer and longer between points 92 and 100. This in turn results in capacitor 30 providing the breakdown voltage to Diac 24 later and later in each half-cycle, causing Triac 18 to go to the ON state and thus providing output voltage to load 14 later and later in each half-cycle, as shown by the plots in FIG. 7.

It should be noted that the average power delivered to load 14 decreases very gradually between points 92 and 98. When load 14 is an incandescent lamp, this decrease is not noticeable.

Between points 98 and 100, however, the average power provided to load 14 decreases at an ever-increasing rate, as shown in FIG. 2A because of the ever-increasing rate of charge of capacitor 46 caused by the clamping of node 51 to the DC level at node 60, as shown by the plots for points 98 and 100 of FIG. 8.

At point 100, capacitor 46 reaches a voltage level (for example, 5.5 volts) sufficient to drive transistor 56 continuously into the saturation region: transistor 56 is always ON; power is not being provided by the time switch to load 14, and the time switch has returned to the normal or OFF state, as shown by point 100 of FIG. 2A.

Figure 2B:
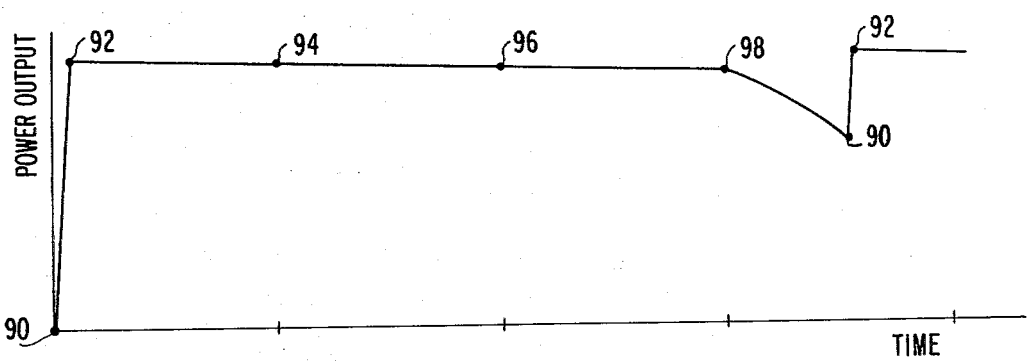
FIG. 2B plots a partial ON cycle followed by a resetting of the ON cycle at point 90, where the vertical axis represents output power and the horizontal axis represents time. At point 90, the user depression of the ON switch restarts the ON cycle.

Because the time switch noticeably starts to turn OFF gradually after 75% of the ON cycle has elapsed, the user may want to prevent the time switch from automatically timing out. This can be done by "resetting" the ON cycle by the user depressing switch 42, causing capacitor 46 to discharge through resistor 44 and to return to the uncharged condition. Resetting can be done by the user at any time during the ON cycle. An example of resetting during the automatic time-out period is illustrated in FIG. 2B between points 98 and 90 and the right-most point 92.

Figure 2C:
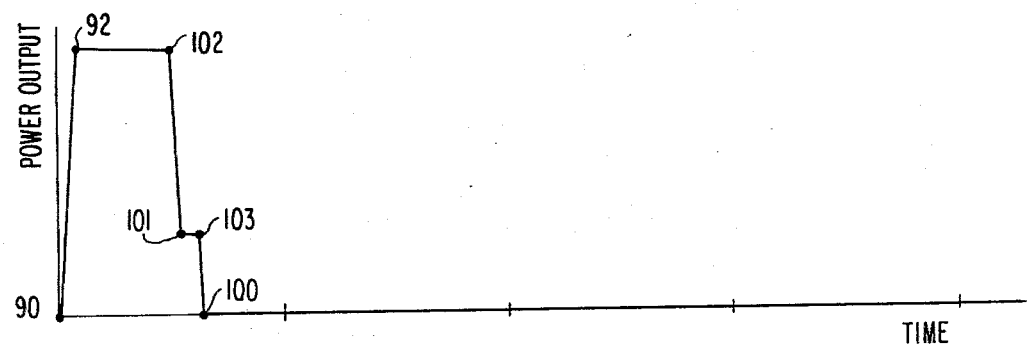
FIG. 2C plots a partial ON cycle with the time switch having been immediately returned by the user to the OFF state at points 102 and 100, where the vertical axis represents output power and the horizontal axis represents time.

Alternately, the user may wish to quickly turn OFF the time switch once the time switch is in the ON cycle without having to wait for the ON cycle to elapse. To turn OFF quickly the time switch, the user need only to depress the switch member of switch 48, causing the contacts of switch 48 momentarily to close. The momentary closing of the contacts results in resistor 50 being bypassed, thus causing capacitor 46 rapidly to charge to full value. As stated above, when capacitor 46 is charged to full value, it continuously drives transistor 56 ON, which keeps the time switch in the normal or OFF state. The 1 second period of time required to turn OFF the time switch using switch 48 is represented by the horizontal distance between points 102, 101, 103 and 100 of FIG. 2C, where points 101 and 103 represent the power output when switch 48 is momentarily closed. It should be understood that the time switch can be quickly turned OFF at any point in the ON cycle.

Figure 2D:
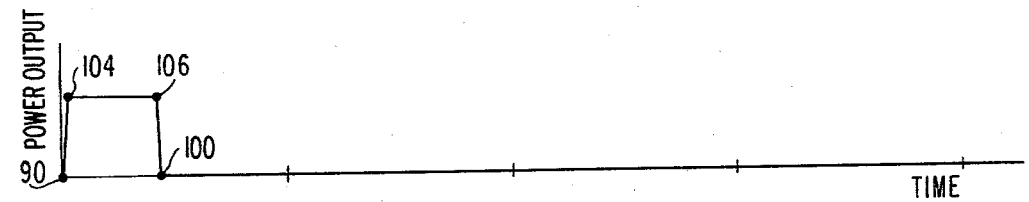
FIG. 2D plots a status check of the time switch where one-third of the normal output power is provided, where the vertical axis represents output power and the horizontal axis represents time.

The user may also wish to check to see if the time switch is functioning normally or may want to momentarily actuate load 14 (e.g., to use the time switch as a low level night light) without providing full power to load 14 or going through the complete ON cycle. The time switch status check can be made by the user continuously depressing the switch member of switch 48, causing the contacts of switch 48 to be kept closed. When the contacts are kept closed, resistor 50 is bypassed, and the signal being applied to the base of transistor 56 is a positive half-wave rectified version of the A.C. supply voltage clamped by capacitor 46. This half-wave rectified voltage causes transistor 56 to be ON only during a portion of each positive half-wave cycle, which means that Triac 18 is ON for less than half of each sine-wave cycle. Thus, the time switch only provides 30% or less of its normal ON power to load 14 when switch 48 is continuously depressed, as shown by points 104 and 106 of FIG. 2D. When the user releases switch 48, capacitor 46 charges quickly to full value, thus driving transistor 56 continuously ON, as shown by points 106 and 100 of FIG. 2D, and the time switch goes to the normal or OFF state. It should be noted that the status check with the time switch can be done during either the ON or OFF state of the time switch, and it allows the time switch to be checked without applying full power to load 14, thus increasing the life of load 14.

Representative values of the components of the time switch of the present invention shown in FIG. 1, which has an ON cycle time of 6 minutes (the time period between points 90 and 100 of FIG. 2A), a ½-second delay between points 90 and 92 of FIG. 2A, and is for use with a 120 volt, 60 Hz A.C. supply, and resistive load are as follows:

TABLE 1*

| | |
|---|---|
| Triac 18 | T2800B (RCA) |
| Inductor 20 | 100 μH |
| Diac 24 | D3202μ |
| Capacitor 26 | .1 μF, 200 volt |
| Capacitor 30 | .1 μF, 200 volt |
| Capacitor 32 | .1 μF, 200 volt |

TABLE 1*-continued

| Resistor 36 | 15 K Ω |
| Variable Resistor 38 | 500 K Ω |
| Resistor 40 | 15 K |
| Resistor 44 | 100 Ω |
| Capacitor 46 | 200 μF, 6 WVDC |
| Resistor 50 | 300 K Ω |
| Diode 52 | 1N4002 |
| Resistor 54 | 4.7 K Ω |
| Transistor 56 | 2N2222 |
| Resistor 58 | 400 K Ω |
| Capacitor 62 | 1 μF, 100 volt |

All resistors may be rated at ½ watt.

Figure 4:
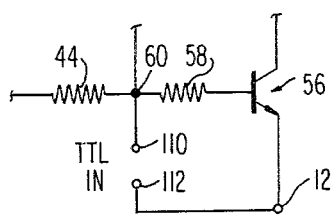
FIG. 4 shows the modification of the electronic circuit of FIG. 1 which allows remote control of the state of the time switch using low voltage control signals.

The first embodiment of the remote control feature, which allows the state of the time switch to be controlled by a remote device, such as a microprocessor or computer, is shown in FIG. 4. In this embodiment, capacitor 46 has been replaced with a pair of leads 110 and 112. Lead 110 is connected to node 60, and lead 112 is connected to terminal 12. Leads 110 and 112 are, in turn, connected to the remote controller (not shown), for example, a transistor-transistor logic switch (TTL) of conventional design (not shown). When the TTL switch is in the high state, leads 110 and 112 are not connected together, and, consequently, transistor 56 is driven to the ON state by the voltage at node 60. Thus, Triac 18 is OFF, and no power is provided by the time switch to load 14. However, when the TTL switch is in the low state, leads 110 and 112 are effectively connected together, causing transistor 56 to be OFF. Thus, Triac 18 is ON, and power is provided by the time switch to load 14. As will be appreciated by those skilled in the art, the TTL switch can be replaced with any remote-controlled switch, such as an electromechanical relay, etc.

Figure 5:
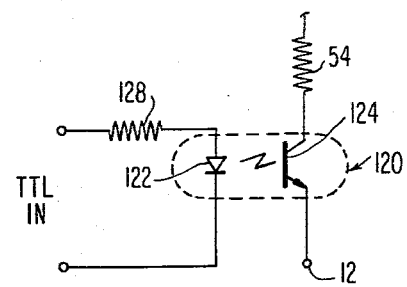
FIG. 5 shows an alternate modification of the electronic circuit of FIG. 1 which allows remote control of the state of the time switch using low voltage control signals.

The second embodiment of the remote-control feature, which allows the state of the time switch to be controlled by a remote device, such as a microprocessor or computer, is shown in FIG. 5. In this embodiment, diode 52, capacitor 46, transistor 56 and resistors 44, 50 and 58 have been replaced with an optically coupled interrupter module 120. Module 120 may include, for example, a gallium arsenide infrared LED 122 coupled with a silicon phototransistor 124 in a common housing. Such a device is available commercially from many sources, including Optron, Inc. of Carrolltron, Texas.

As shown in FIG. 5, the anode of LED 122 is connected via a resistor 128 to one side of a TTL switch (not shown), and the cathode of LED 122 is connected directly to the other side of the TTL switch. The TTL switch provides driving current when in the high state to the LED 122. The value of resistor 128 is chosen so that the driving current does not damage LED 122. The emitter of phototransistor 124 is connected to terminal 12, and the collector is connected to resistor 54.

When the TTL switch is in the high state and is providing driving current to LED 122, phototransistor 124 is turned ON. By being ON, phototransistor 124 causes Triac 18 to be OFF and the time switch is in the normal or OFF state. The time switch remains in this OFF state until the TTL switch goes to the low state and no longer provides driving current to LED 122.

It should be noted that both of the embodiments of FIGS. 4 and 5 allow the time switch to be remotely controlled by using low voltage level control signals.

Figure 6:
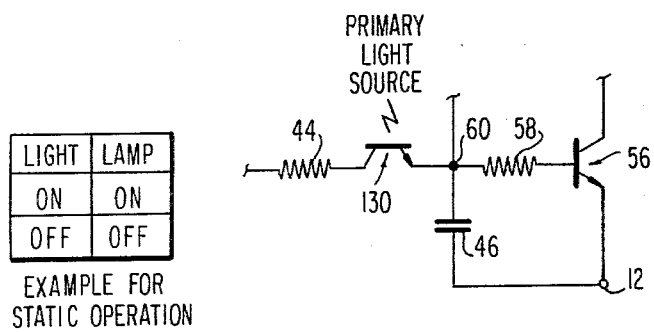
FIG. 6 shows the modification of the electronic circuit of FIG. 1 which allows the state of the time switch to be controlled by the level of a source of light being sensed.

The embodiment of the ambient light control feature, which allows the state of the time switch to be controlled by sensing the ambient light level, is shown in FIG. 6. In this embodiment, a phototransistor 130 is interposed between resistor 44 and node 60. Specifically, the collector of phototransistor 130 is connected to resistor 44 and the emitter is connected to node 60. As is well known in the art, a phototransistor is driven to the ON state when the level of the incident light impinging on its base surface exceeds a predetermined amount. Thus, in the static version where capacitor 46 is omitted, phototransistor 130 automatically changes the state of the time switch from the normal or OFF state to the ON state when the incident light exceeds the predetermined level, and keeps the time switch in that ON state until the incident light drops below the predetermined level. In the dynamic version where capacitor 46 is connected as shown in FIG. 6, the length of the ON state is determined by the value of capacitor 46 and the time switch times out in accordance with the normal on cycle as described. It is apparent that phototransistor 130 can be provided at a location remote from the time switch or can be oriented so as to be responsive to any desired source of light. The embodiment of the time switch shown in FIG. 6 is useful for many purposes, including, among others, automatically controlled lighting, or the sensing of automobile headlights, for example, automobile headlights in driveway, etc.

The basic embodiment of the time switch shown in FIGS. 1 and 3 and the alternate embodiments shown in FIGS. 4, 5 and 6 can be packaged in any convenient housing or the like. One suitable housing arrangement is to mount the entire time switch in a package that fits in a standard light switch box. In such an arrangement, switches 42 and 48 are provided on the front surface and terminals 12 and 16 on an interior side or back surface. If it is desired to have switches 42 and 48 remote from the main body of the time switch, it should be noted that only four wires are required between the main body and switches 42 and 48 or only 2 wires are necessary for the embodiments shown in FIGS. 4 and 5.

What is claimed is:

1. An electronic switch operated by a first user command and a second user command for use with an A.C. power system and of the type having a Triac with two main leads and a gate lead, the two main leads being connected in series with the load to be switched, the improvement comprising means connected to said gate lead and to said A.C. power system for providing a trigger pulse for each half-cycle of said A.C. power system only during a predetermined time period after receipt of said first user command.

2. The electronic switch as recited in claim 1 wherein said means includes:
   (a) first timing means connected to said A.C. power system for providing a first predetermined signal voltage after the lapse of said predetermined time period;
   (b) a Diac having a first lead connected to said gate lead and a second lead, said Diac having a negative preselected breakdown voltage and a positive preselected breakdown voltage;
   (c) trigger pulse means connected between said two main leads of said Triac for normally providing for each half-cycle said preselected breakdown voltage to said Diac; and
   (d) switch means responsive to said first timing means for preventing said trigger pulse means from providing said preselected breakdown voltage when said first predetermined signal voltage is present.

3. The electronic switch as recited in claim 2 wherein said means further includes a second timing means connected to said first timing means for resetting said predetermined time period after receipt of said first user command.

4. The electronic switch as recited in claim 3 wherein said first timing means includes switch means for causing the immediate generation of said first predetermined signal voltage upon receipt of said second user command.

5. The electronic switch as recited in claim 4 wherein said means further includes capacitor means connected between one of said two main leads of said Triac and said trigger pulse means, said capacitor means charging to a higher voltage level than said trigger pulse means so as to restore said voltage level of said trigger pulse means after each said trigger pulse.

6. The electronic switch as recited in claim 2 wherein said means further includes capacitor means connected between one of said two main leads of said Triac and said trigger pulse means, said capacitor means charging to a higher voltage level than said trigger pulse means so as to restore said voltage level of said trigger pulse means after each said trigger pulse.

7. The electronic switch as recited in claim 2 wherein said trigger pulse means includes variable resistor means for providing dimmer action.

8. The electronic switch as recited in claim 2 wherein said first timing means includes in series connection a diode, a first resistor and a first capacitor connected between said first main terminal of said Triac and said junction of said capacitor means and said trigger pulse means.

9. The electronic switch as recited in claim 1 wherein each said trigger pulse being provided to said gate lead during said predetermined time period satisfies a time relationship continuum having a first end point where each said trigger pulse at the beginning of said predetermined time period is provided near the beginning of said corresponding half-cycle, and having a second end point where each said trigger pulse at the end of said predetermined time period is provided near the end of said corresponding half-cycle, whereby said Triac exhibits successively more off time as the end of said predetermined time period approaches.

10. The electronic switch as recited in claim 1 further comprising a series-connected resistor and a capacitor connected between said two main leads of said Triac.

* * * * *